United States Patent [19]

Okado

[11] Patent Number: 4,721,869
[45] Date of Patent: Jan. 26, 1988

[54] PROTECTION CIRCUIT FOR AN INSULATED GATE BIPOLAR TRANSISTOR UTILIZING A TWO-STEP TURN OFF

[75] Inventor: Chihiro Okado, Fuchu, Japan
[73] Assignee: Kabushiki Kaisha Toshiba, Kawasaki, Japan
[21] Appl. No.: 826,771
[22] Filed: Feb. 6, 1986

[30] Foreign Application Priority Data

Feb. 8, 1985 [JP] Japan .................................. 60-23334
Apr. 30, 1985 [JP] Japan .................................. 60-92870

[51] Int. Cl.$^4$ ...................... H03K 17/08; H03K 17/28
[52] U.S. Cl. ................................... 307/570; 307/200 B; 307/270; 307/592; 307/597; 361/86; 361/88; 361/89; 361/101
[58] Field of Search ............... 307/200 A, 200 B, 547, 307/549, 264, 270, 592, 597, 318, 570; 361/86–88, 79, 92, 100, 101, 89

[56] References Cited

U.S. PATENT DOCUMENTS

| | | | |
|---|---|---|---|
| 4,301,490 | 11/1981 | Nagel et al. ..................... | 361/100 X |
| 4,360,744 | 11/1982 | Taylor ............................. | 307/270 X |
| 4,363,064 | 12/1982 | Billings et al. .................. | 361/100 X |
| 4,363,068 | 12/1982 | Burns .............................. | 307/200 B X |
| 4,536,816 | 8/1985 | Mausumura et al. ............ | 361/100 X |
| 4,543,494 | 9/1985 | Wakimoto ....................... | 307/264 X |
| 4,591,734 | 5/1986 | Laughton ........................ | 307/270 X |
| 4,612,457 | 9/1986 | Prater ............................. | 307/270 X |

OTHER PUBLICATIONS

Smith, M. W., "Applications of Insulated Gate Transistors", Factory Electronics, 1983, Manufacturers, pp. 1–11.
Baliga, et al., "Modulated-Conductivity Devices Reduce Switching Losses", EDN, Sep. 1983.

Primary Examiner—Stanley D. Miller
Assistant Examiner—D. R. Hunspeth
Attorney, Agent, or Firm—Schwartz, Jeffery, Schwaab, Mack, Blumenthal & Evans

[57] ABSTRACT

A driving circuit for an insulated gate bipolar transistor (IGBT) which has a power source, a gate voltage input circuit which supplies the voltage to a gate terminal of IGBT, a detecting circuit for detecting a collector to emitter voltage of the IGBT and an adjusting circuit for lowering the control signal.

When an abnormality is detected by the detecting circuit, the adjusting circuit performs a dropping operation of the gate voltage of the IGBT immediately after the detection or after the passage of a predetermined time following the application of the ON signal to the gate.

15 Claims, 19 Drawing Figures

COLLECTOR TO
EMITTER VOLTAGE (VCE)

PROTECTION CIRCUIT FOR AN INSULATED GATE BIPOLAR TRANSISTOR UTILIZING A TWO-STEP TURN OFF

BACKGROUND OF THE INVENTION

1. Field of the Invention

This invention relates to a driving circuit for an insulated gate bipolar transistor (hereinafter referred to as IGBT) which drives the gate of the IGBT safely without accompanying overcurrent phenomena.

2. Prior Art

Many types of power converters which convert d.c. to a.c. or d.c. to d.c. using IGBT elements have been proposed. This IGBT has an insulated gate and is operated in a bipolar mode. The IGBT has features of short switching time and low ON voltage. Therefore this element enables miniaturization, low cost and high frequency control of high power which cannot be performed by conventional bipolar transistors or MOS FETs.

FIG. 1 is a circuit diagram of a fundamental chopper using an IGBT. According to FIG. 1, an IGBT 1 and a load 3 are connected in series to both terminals of a d.c. power source 2. Power is supplied to the load 3 by on-off controlling the IGBT 1.

In order to achieve on-off control of the IGBT 1, serially connected power sources 4 and 5 for gate and serially connected NPN transistor 6 and PNP transistor 7 are connected in parallel, and the common connection point of transistors 6 and 7 is connected to the gate terminal of IGBT 1. Moreover, the bases of transistors 6 and 7 are commonly connected to an input terminal 8 for the driving voltage.

When a positive signal is applied to the input terminal 8, transistor 6 turns on and the positive voltage is supplied to the gate of the IGBT 1 from the power source 4, resulting in turning-on of the IGBT 1.

On the other hand, when a negative signal is applied to the input terminal 8, negative voltage is supplied to the gate of the IGBT 1 to turn it off.

In this case, the relation between ON voltage, that is a collector to emitter voltage $V_{CE}$ when the IGBT is in the ON state, and the ON current, that is, a collector current $I_C$ when the IGBT is in the ON state, is shown in the graph of FIG. 2. The relation between the collector to emitter voltage and the maximum collector current $I_{CMAX}$ is shown in FIG. 3.

It will be seen from FIG. 2 that the IGBT has intermediate characteristics between transistor and thyristor, that is, it shows constant current characteristics similar to transistors in low gate voltage areas and low voltage drop in high gate voltage areas.

It is apparent that if the IGBT is driven at a higher gate voltage $V_{GE}$ and the lower is the ON voltage $V_{CE}$, thus the power loss of the IGBT 1 is decreased.

However, there is a problem that the IGBT often breaks down due to overcurrent within the range as shown by hatching lines in FIG. 3, when a shortcircuit accident of the load 3 in FIG. 1 occurs, because the voltage of d.c. power source is directly applied across the collector and emitter.

Considering such accident, if the IGBT is driven at a low gate voltage $V_{GE}$, there occurs another problem that the power loss increases because the voltage $V_{CE}$ increases.

FIG. 4 shows the switching characteristics of an IGBT, in which collector to emitter voltage $V_{CE}$ begins to drop with a time delay Td after turning the gate voltage $V_{GE}$ from negative to positive, and it drops below 10 V at Tf. For a high speed IGBT, Td is approx. 0.5 µs and Tf is approx. 1 µs.

Thus, it is difficult to determine whether a shortcircuit accident occurs or not unless it is determined whether the high collector to emitter voltage is caused by either overcurrent or transient phenomena, since the turn-on operation has the above-mentioned delay in relation to the gate voltage $V_{GE}$.

In the case of some types of IGBT, a direct shortcircuit is prohibited.

As to such type of IGBT, IGT (Insulated Gate Transistor) of GE corporation is known and introduced in, for example, "Application of Insulated Gate Transistors" (Factory Electronics, 1983).

FIG. 5 shows the safe operation area (SOA) of such IGBT and it is understood that, for example, the element having gate to emitter resistance $R_{GE}=5k$ can always be operated safely if the collector current is limited to 20 A or less.

However, if a current larger than the rated maximum current is turned off, the so-called latch-up phenomena occurs and the collector current $I_C$ cannot be made to 0 when the gate voltage $V_{GE}$ is made to 0. Moreover the element will be damaged because of an increase in current density in the element. Therefore it is necessary to prevent the IGBT operation beyond the SOA.

SUMMARY OF THE INVENTION

It is an object of the present invention to provide a driving circuit for IGBT which can decrease the power loss during normal operation.

It is another object of the present invention to provide a driving circuit for IGBT which prevents the damage of the IGBT when an overcurrent accident occurs.

Therefore, according to the present invention, there is provided a driving circuit for an insulated gate bipolar transistor comprising: a power source for supplying a constant voltage; a gate voltage input circuit for applying said constant voltage to a gate terminal of an insulated gate bipolar transistor according to a control signal; a detecting circuit for detecting a collector to emitter voltage of said insulated gate bipolar transistor; and an adjusting circuit for lowering the control signal voltage according to the output of the detecting circuit, whereby said gate voltage is reduced.

DESCRIPTION OF THE PREFERRED EMBODIMENTS

Figure 1:
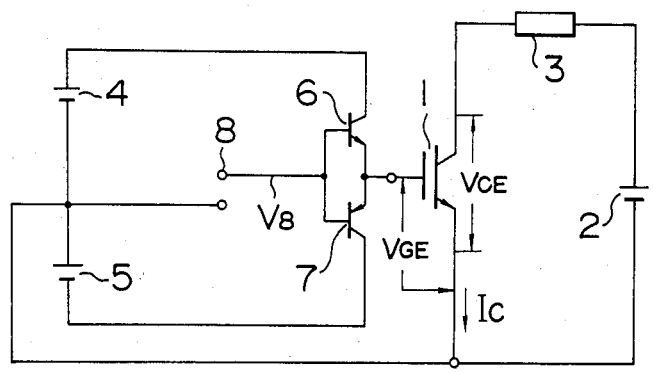
FIG. 1 is a circuit diagram of a conventional driving circuit.
Figure 2:
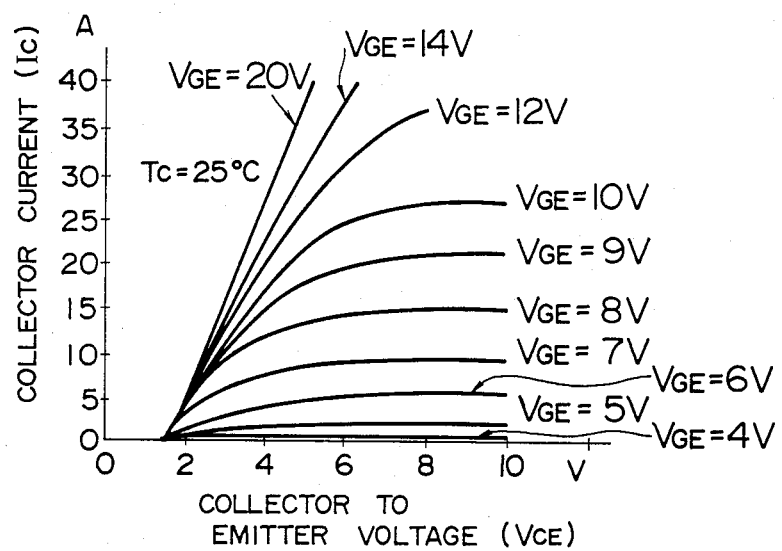
FIG. 2 is a graph showing the relation between $V_{CE}$ and $I_C$.
Figure 3:
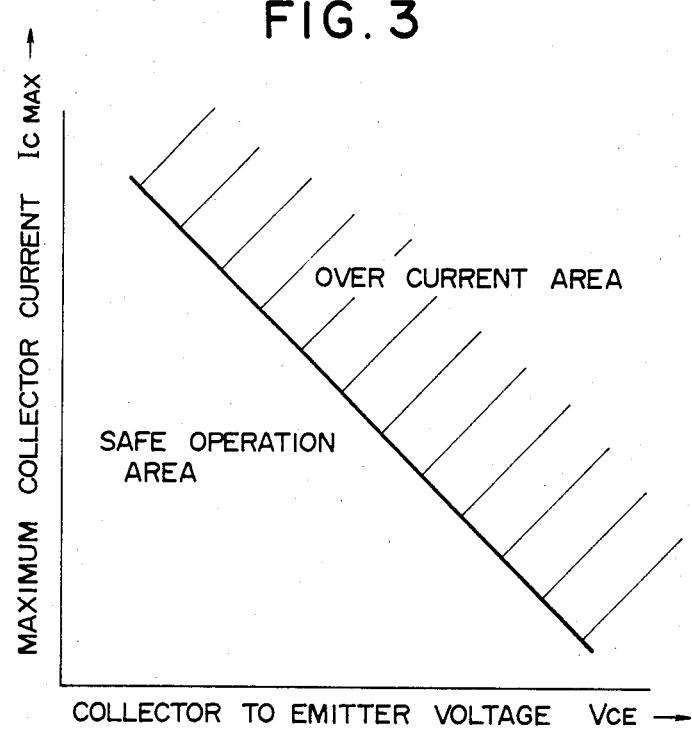
FIG. 3 is a graph showing a safe operation area (SOA)
Figure 4:
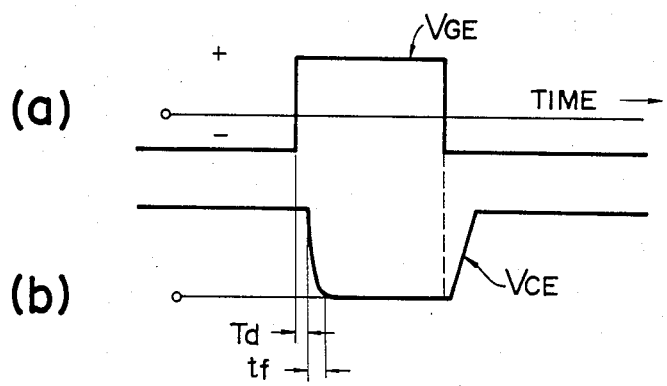
FIG. 4 is a timing chart showing the switching characteristics of an IGBT.
Figure 5:
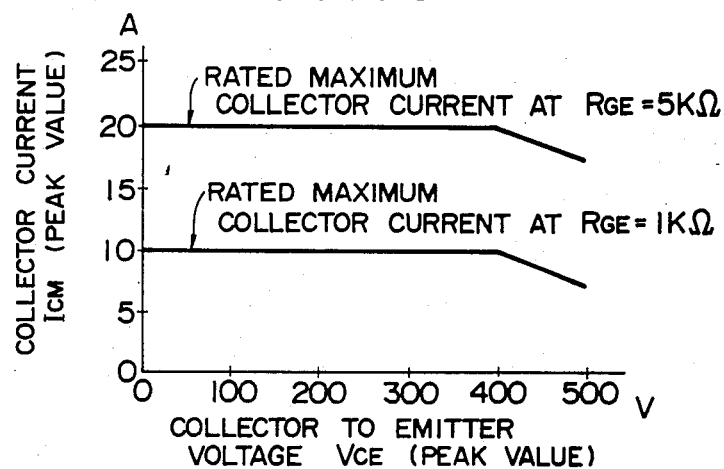
FIG. 5 is a graph showing the SOA of some types of IGBT.
Figure 6:
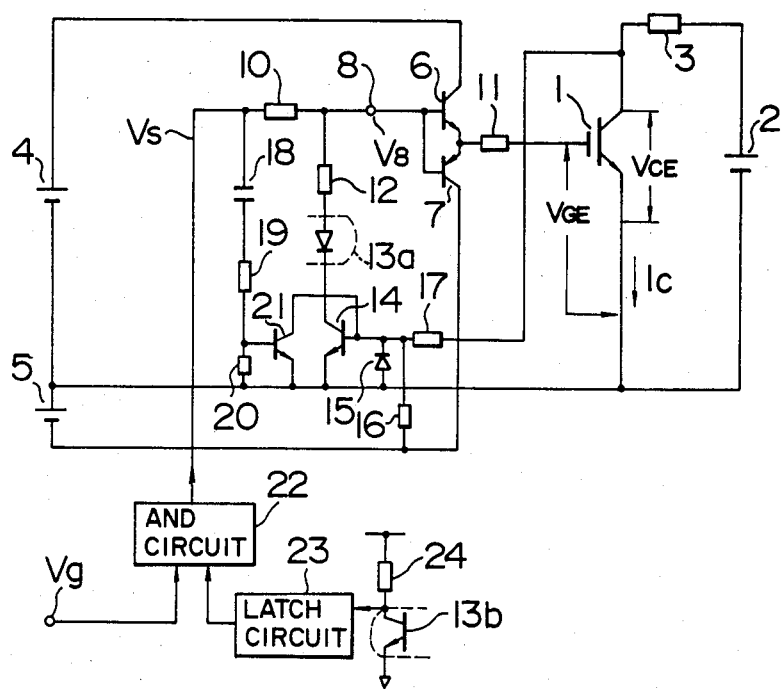
FIG. 6 is a circuit diagram of a preferred embodiment of the invention.

FIG. 6 is a circuit diagram of an embodiment of the present invention and the same reference numerals as shown in FIG. 1 denote the same elements.

In FIG. 6, IGBT 1 and a load 3 are connected in series to a d.c. power supply 2. Power supplies 4 and 5 are connected in series to each other and to NPN transistor 6 and PNP transistor 7. The two transistors are connected complementarily.

The bases of transistors 6 and 7 are commonly connected to the input terminal 8. A series circuit composed of a resistor 10, a capacitor 18, resistors 19 and 20, and a series circuit composed of a resistor 12, a light emitting diode 13a of a photo coupler 13 and transistor 14 are connected across the input terminal 8 and the common connecting point between power supplies 4 and 5.

The common emitter connecting point of transistors 6 and 7 is connected to the gate of IGBT 1 through a resistor 11. The base of the emitter-follower transistor 14 is connected to the positive electrode of the power source 5 through a diode 15, then connected to the negative electrode of the power source 5 through a resistor 16, and then connected to the collector of IGBT 1 through a resistor 17.

An NPN transistor 21 is provided across the base of the transistor 14 and the positive electrode of power source 5, and the base of transistor 21 is connected to the common connection point of resistors 19 and 20.

A photo transistor 13b of the photo coupler 13 is connected to the positive power source, not shown, through a resistor 24, and this transistor 13b converts the voltage generated at the common connection point of the transistor 13b and the resistor 24 to the logic level. This logic level signal is input to the latch circuit 23 and the output of the latch circuit 23 is input to an AND circuit which outputs logical multiplication of the output of latch circuit 23 and the control signal $V_G$.

Figure 7:
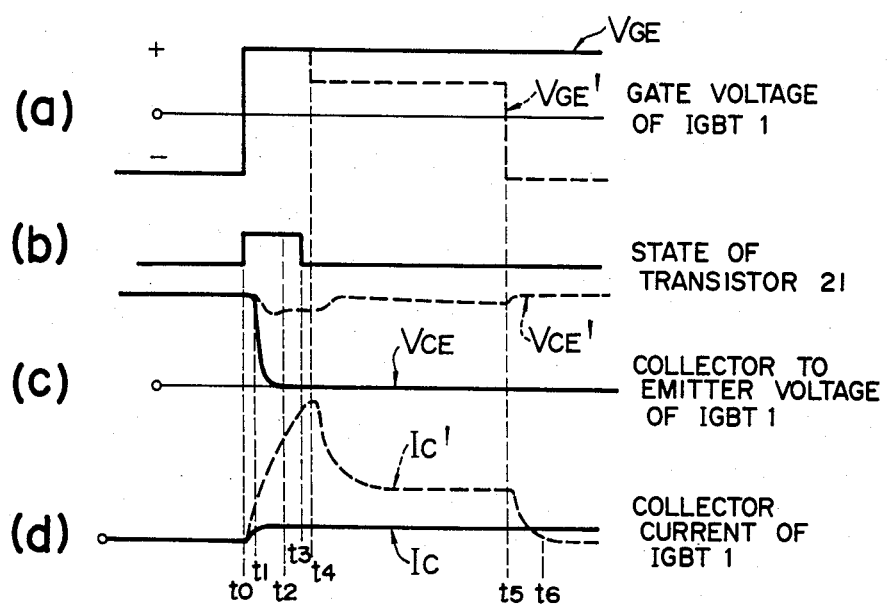
FIG. 7 is a timing chart illustrating the operation of the circuit shown in FIG. 7.

The operation of the circuit shown in FIG. 6 is explained referring to a timing chart shown in FIG. 7. In FIG. 7, (a) shows the gate voltage of IGBT 1, (b) ON and OFF states of the transistor 21, (c) collector to emitter voltage of IGBT 1 and (d) the collector current of IGBT 1. In these charts, the continuous line denotes the condition when no abnormality exists in the load 3 and the short dashes line denotes the condition when the load 3 is in a shortcircuit state or near a shortcircuit state.

First, when the load 3 is in a normal state, at the time $t_0$, the driving signal $V_s$ changes from negative to positive, transistor 21 becomes ON after a predetermined time $t_3$ obtained by the capacitor 18 and the resistor 19 which form a differential circuit, because the base current is supplied to the transistor 21. When the transistor 21 turns on, the base and emitter of the transistor 14 are shortcircuited and the transistor 14 turns off, thus no current flowing through the light emitting diode of the photocoupler. Therefore the voltage $V_8$ becomes high, and after this high level signal is amplified, it is applied to the gate of IGBT 1 as the gate voltage $V_{GE}$. As described above, IGBT turns on with the delay time Td, starts turn-on operation at $t_1$ and finishes the turn-on operation at $t_2$.

At $t_3$, transistor 21 turns off and a reverse bias voltage is applied across the base and emitter of the transistor 14 because the bias voltage is generated by the current which flows through the diode 15 and the resistor 16. Therefore, the transistor 14 does not turn on unless the current from the collector of IGTI flows therethrough and through the resistor 17 more than the current flows through the diode 15 and the resistor 16.

In this embodiment, the value of the resistor 17 is selected so that the transistor 14 is turned on when the collector to emitter voltage $V_{CE}$ becomes 10% of the value of the d.c. power source 2.

Thus, if the transistor 21 is turned off, the transistor 14 does not turn on, thus the gate voltage $V_{GE}$ being held positive during the term when the control voltage $V_G$ is positive, and the collector current $I_C$ flows as shown in FIG. 7(d). After $t_3$, when the collector to emitter voltage $V_{CE}$ is 1 V or less, the IGBT can be driven in a low loss mode.

Next, if the load 3 is in a near shortcircuit condition, and at $t_0$ the driving signal $V_S$ changes from negative to positive, the IGBT initiates a turn-on operation and the collector current $I_C'$ increases rapidly. When the collector current $I_C'$ of IGBT 1 reaches 3 times to 6 times of the rated current, the collector to emitter voltage $V_{CE}'$ also increases rapidly As a result, when the current more than the bias current which is determined by the resistance of the resistor 16 and the voltage of the power source 5 flows, the transistor 14 is turned on. Consequently, the driving signal $V_S$ is divided in voltage by the resistors 10 and 12, and the gate voltage $V_{GE}'$ drops below the half of the peak value at time $t_4$.

When the gate voltage $V_{GE}'$ drops as shown in FIG. 7, the operation mode of the IGBT 1 enters in the area where the collector current is small and the collector to emitter voltagge $V_{CE}'$ tends to increase. Moreover, since the IGBT has a constant current characteristic within the range, the collector current $I_C'$ decreases rapidly.

Because of turning on the transistor 14, the light emitting diode 13a of photocoupler 13 is supplied with current to emit light, and the receiver, the phototransistor 13b turns on and the input voltage of the latch circuit 23 drops. Since the latch circuit 23 has a delay element, the output of the latch 23 changes to "L" level at $t_5$. Accordingly, the driving signal $V_s$ changes to "L" level, even if the control signal $V_G$ having "H" level is input to the AND circuit 22. Therefore the gate voltage $V_{GE}'$ turns a negative value to break the accidental current, and then the collector current $I_C'$ becomes exactly 0.

The reason why the latch circuit has the delay element is to prevent misoperation and to suppress the surge voltage during breaking operation by the two step breaking operation in which the accidental current is decreased at $t_4$ in FIG. 7 first and then the collector current is made to 0. It is identified that the effective time interval between $t_0$ and $t_3$ is 2-3 μs and that the effective time interval between $t_3$ and $t_5$ is 5-10 μs.

Figure 8:
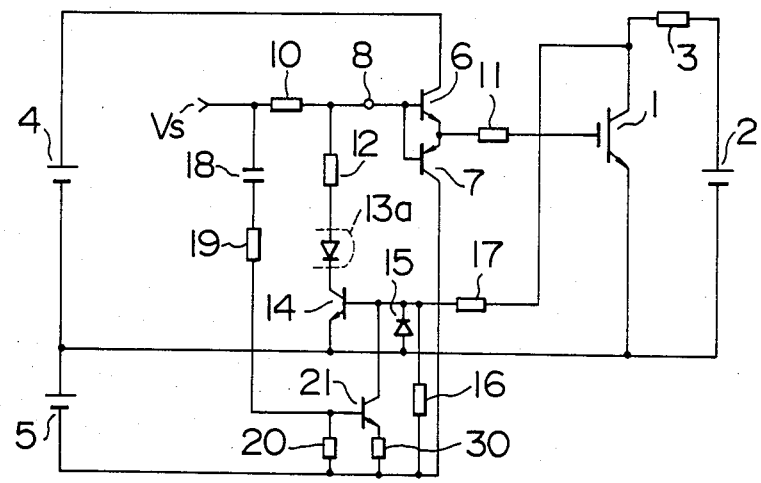
FIG. 8 is a circuit diagram of a preferred embodiment of the invention.

FIG. 8 is a circuit diagram of another embodiment according to the present invention, and the elements referred to by the same numerals as in FIG. 6 show the same elements. In order to supply a charge current having a time constant, that is, the current flowing through the capacitor 18 and resistors 19 and 20, to the diode 15, the emitter of the transistor 21 is connected to the negative electrode of the power source 5 through a resistor 30, and the terminal of the resistor 20 is connected to the negative electrode of the power supply 5.

According to FIG. 8 the collector current of transistor 21 once increases at an instant when the driving signal $V_S$ turns positive, and then it decreases exponentially.

This circuit composition makes it possible to detect accidents faster according to the decrease in the collector to emitter voltage $V_{CE}$ which occurs based on the turning-on characteristics of the IGBT 1.

Figure 9:
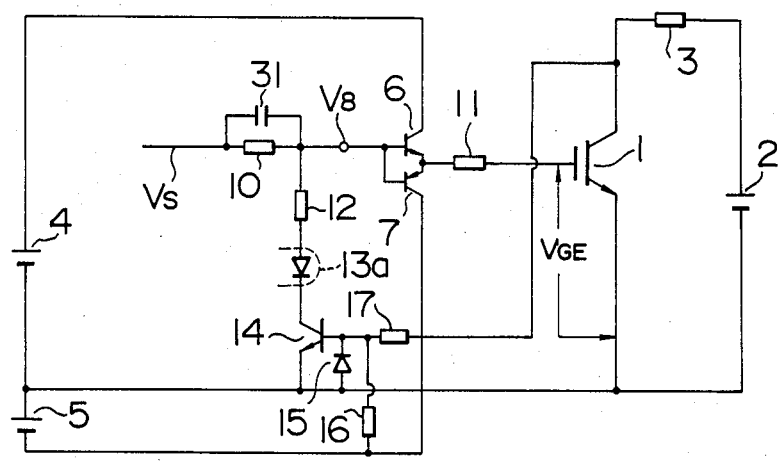
FIG. 9 is a further preferred embodiment of the invention.

FIG. 9 is a circuit diagram of a further embodiment according to the present invention. In comparing this embodiment to FIG. 6, it may be seen that the series-connected circuit composed of a capacitor 18, resistors 19 and 20 and a transistor 21 is removed from the circuit shown in FIG. 6 and a capacitor 31 is connected in parallel to the resistor 10.

Figure 10:
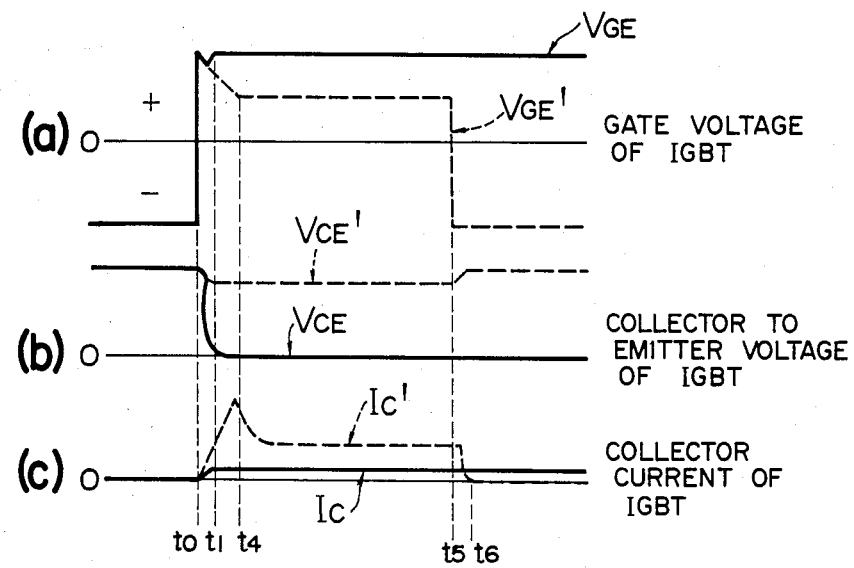
FIG. 10 is a timing chart illustrating the operation of the circuit shown in FIG. 10.

FIG. 10 is a timing chart for explaining the operation, in which (a) shows changes in the gate voltage of IGBT 1, (b) shows the changes in the collector to emitter voltage, and (c) shows the changes in the collector current of IGBT 1. In this chart, the continuous lines denote the condition when no abnormality exists in load 3 and the short dashes lines denote the condition when the load 3 is in a shortcircuit state.

In this embodiment, the transistor 14 is in an ON state at time $t_0$, and when the driving signal $V_S$ turns positive, the driving voltage $V_8$ is instantaneously equal to the driving signal $V_S$. At the moment, if the load is in a shortcircuit condition, the collector current $I_C'$ increases rapidly but the collector to emitter voltage $V_{CE}'$ does not decrease, and the transistor 14 holds an ON state. While the gate voltage $V_{GE}'$ drops as the decrease of the charge current for capacitor 31, and at $t_4$, the gate voltage $V_{GE}'$ is equal to the normal value so that the collector current $I_C'$ is decreased.

When the load 3 is in a normal state, since the collector to emitter voltage $V_{CE}$ lowers at time $t_1$ as a result of turning on the IGBT 1, the gate voltage $V_{GE}$ lowers slightly and returns to the normal voltage soon. At this time, the collector to emitter voltage $V_{CE}$ becomes low, which denotes a completely saturated mode. This makes it possible to operate with minimum loss.

In the above embodiment, the voltage adjusting circuit composed of a resistor 12, light emitting diode 13a of the photocoupler and a transistor 14 is connected to the bases of complementarily connected transistors 6 and 7. However, when the power loss is a minor problem, the voltage adjusting circuit may be connected to the common emitter point of transistors 6 and 7.

Moreover, the technique to lower the gate voltage when the collector to emitter voltage exceeds the predetermined value is applicable to overcurrent protection of general FET.

Figure 11:
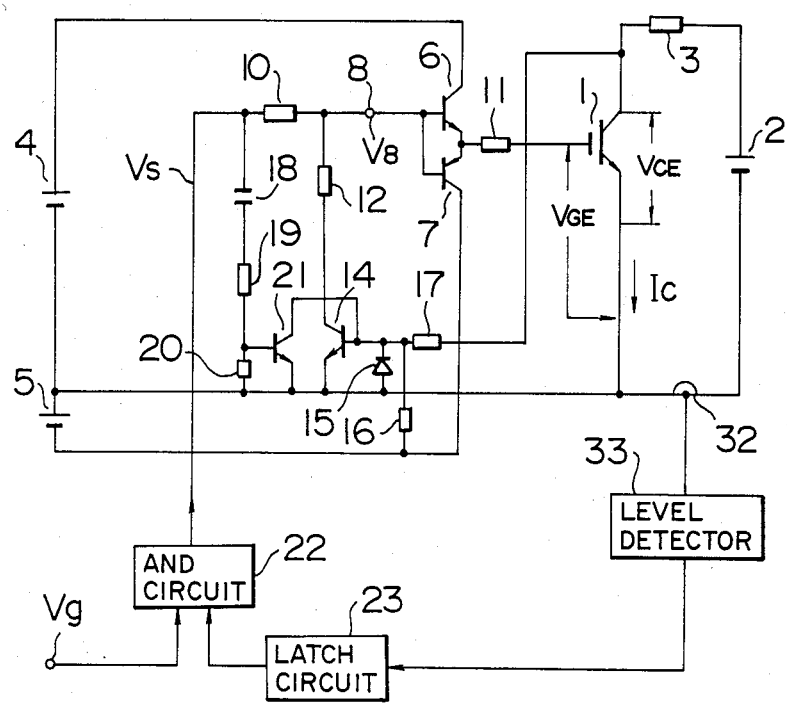
FIG. 11 is a still further preferred embodiment of the invention.

FIG. 11 is a circuit diagram showing another embodiment of the invention. According to FIG. 11, the photocoupler 13 shown in FIG. 6 is removed and a current detector 32 is provided between the emitter of the IGBT 1 and the negative electrode of the power source 2. The output of the current detector 32 is input to the latch circuit 23 through a level detector 33.

In this circuit, the accidental collector current is detected directly by the current detector 32 and when the collector current exceeds the predetermined value, the collector to emitter voltage is adjusted by the same operation as described above.

Figure 12:
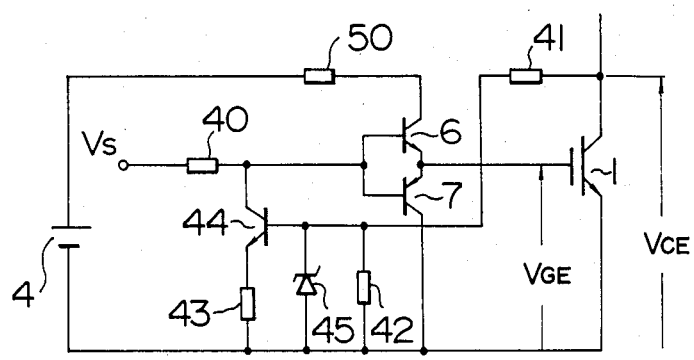
FIG. 12 is a circuit diagram of another preferred embodiment of the invention.

FIG. 12 is a circuit diagram of an embodiment of the present invention. According to FIG. 12, the voltage of the power source 4 is applied to the gate of the IGBT 1 through the complementarily connected transistors 6 and 7 to whose common base connection point the driving signal $V_S$ is applied. To the base common connection point as mentioned above, the collector of the NPN transistor 14 is connected, the emitter of the transistor 44 is connected to the negative electrode of the power source 4 through a resistor 43, and the base of transistor 44 is connected to the collector of the IGBT 1 through a resistor 41. A Zener diode 45 and a resistor 42 are connected in parallel across the base of the transistor 44 and the negative electrode of the power source 4.

The operation of this circuit is as follows:

Resistors 41 and 42 form a bleeder which divides the collector to emitter voltage $V_{CE}$, as a result of which at both ends of the resistor 42, a voltage which is proportional to the $V_{CE}$ appears. Since the transistor 44 and the resistor 43 compose an emitter-follower, the collector current of transistor 44 is proportional to the voltage drop at the resistor 42.

Figure 13:
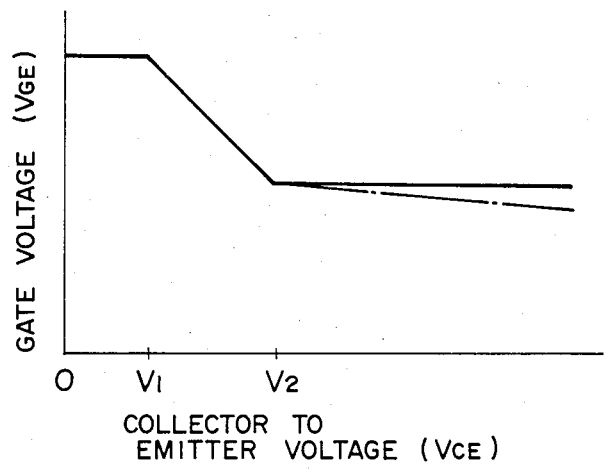
FIG. 13 is a graph illustrating the relation between $V_{CE}$ and $V_{GE}$ in the circuit shown in FIG. 13.

When the transistor 44 is in an OFF state, the driving signal $V_S$ is power amplified by the transistors 6 and 7 and applied to the gate of the IGBT 1 as the gate voltage $V_{GE}$. As to the conditions for OFF state of transistor 44, it is necessary that the voltage drop between emitter and the base is larger than that of resistor 42. Therefore the collector to emitter voltage of the IGBT 1 is not more than 1 V which generates the voltage drop at the resistor 42 exceeding the voltage drop across the emitter and the base of the transistor 44. If the voltage $V_{CE}$ exceeds this voltage V1 as shown in FIG. 13, transistor 44 begins to send the collector current, which is in proportion to the voltage drop of the resistor 12 as described above. Thus this collector current generates the voltage drop at the resistor 40, and consequently the driving signal Vs lowers and the gate voltage $V_{GE}$ also drops until the collector voltage $V_{CE}$ lowers to the voltage V1 which cannot send the collector current through the emitter-follower. When the collector voltage $V_{CE}$ further rises and exceeds the predetermined voltage V2, the Zener diode 15 prevents the voltage from rising. As a result, the voltage $V_{GE}$ is maintained at a predetermined minimum value.

Figure 14A:
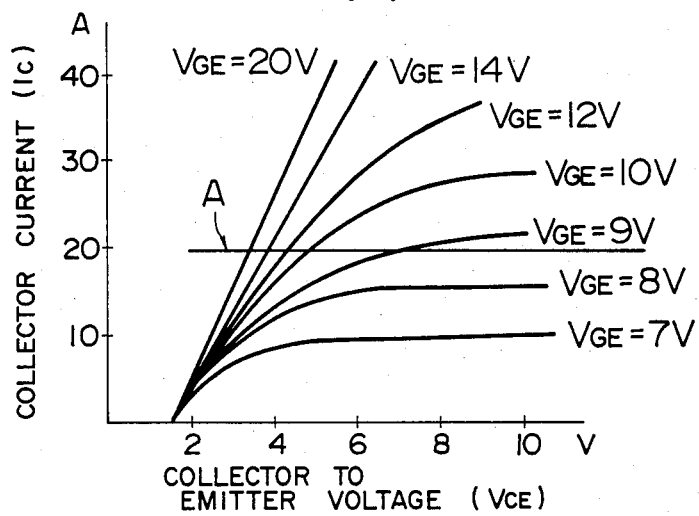
FIG. 14 shows the operation obtained by controlling the gate voltage.
Figure 14B:
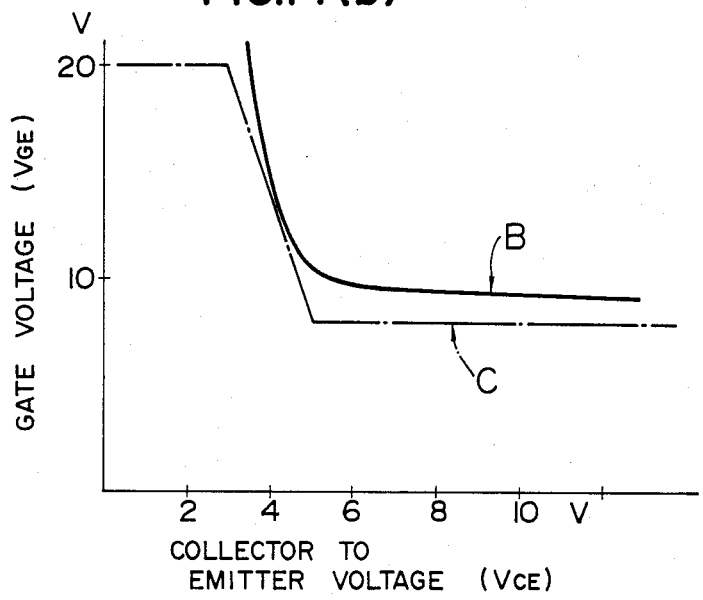

FIG. 14 is a graph illustrating the operation by the control of the gate voltage $V_{GE}$, and FIG. 14 (a) illustrates a line A for $I_c=20$ A which is the limit line for preventing latch-up phenomena. A line shown in FIG. 14(b) shows the plotted points where line A and the $V_{GE}$ curves are crossed in FIG. 14(a). A line C in FIG. 14(b) is an approximate line of curve B. The maximum gate voltage $V_{GE}$ can be determined by selecting the characteristics of the emitter-follower transistor 44 and resistances of resistors 41 and 42 which divide $V_{CE}$, and the minimum value of gate voltage $V_{GE}$ can be determined by selecting the characteristics of the Zener diode 15. Thus the current flowing through the IGBT can always be controlled within the maximum permissible current by controlling the gate voltage $V_{GE}$ of IGBT within a predetermined range.

FIG. 15 to FIG. 19 are circuit diagrams of other embodiments according to the present invention.

Figure 15:
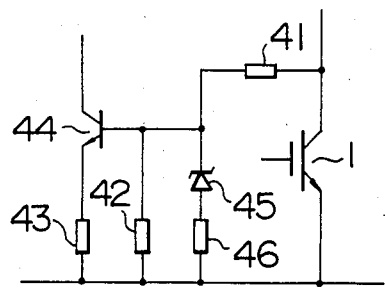
FIGS. 15, 16, 17, 18 and 19 are circuit diagrams of preferred embodiments of the invention.

In FIG. 15, a resistor 46 is added to the Zener diode 45 in series. In this embodiment, the gate voltage $V_{GE}$ when the collector to emitter voltage of the IGBT rises is shown as a dashed line in FIG. 14, because some voltage drop is generated at the resistor 16. This makes it possible to approximate the constant current characteristics more precisely.

Figure 16:
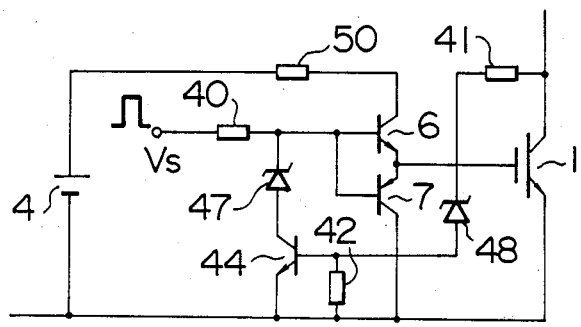

FIG. 16 is a circuit diagram of another embodiment of the invention, in which Zener diodes 47 and 48 are provided at collector and base of the emitter-follower transistor 44. However, the Zener diode across the base and emitter of the transistor 44 and the resistor at the emitter are removed. In this circuit, two Zener diodes 17 and 18 determine the collector voltages V1 and V2 which vary the gate voltage $V_{GE}$, thus the gate voltage $V_{GE}$ changes its value alternately between V1 and V2, which is sufficient in practice.

Figure 17:
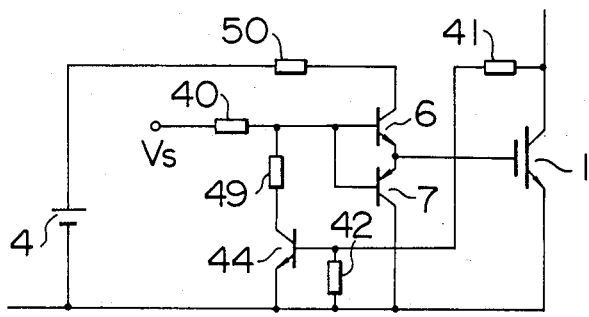

FIG. 17 shows a circuit diagram of another embodiment, in which a resistor 49 is substituted for the Zener diode and the Zener diode in FIG. 16 is removed. The fundamental operation of this embodiment is similar to that of the circuit shown in FIG. 16.

Figure 18:
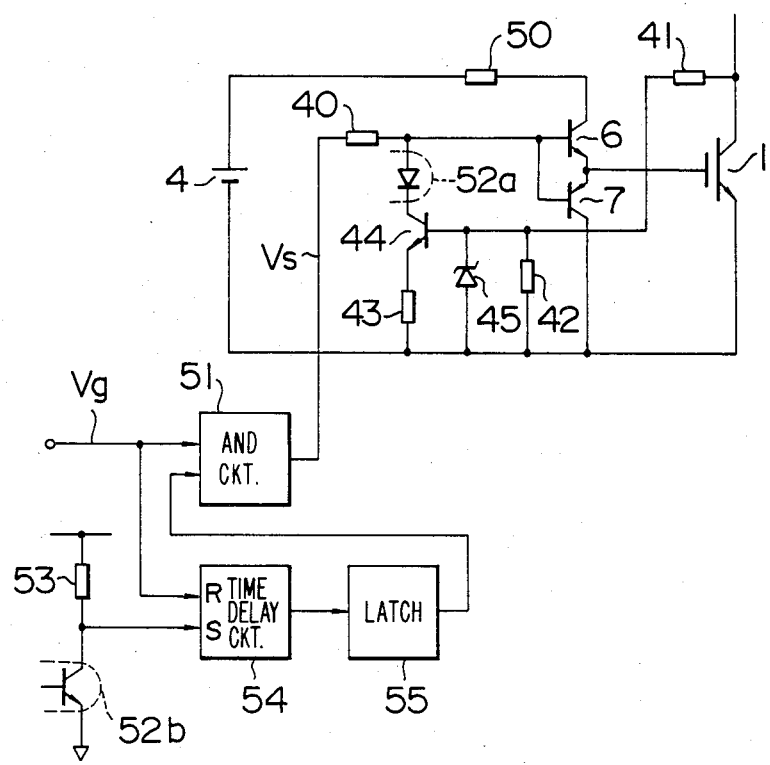

FIG. 18 shows the control circuit which supplies the driving signal to the circuit shown in FIG. 17.

In this circuit, the control signal $V_G$ is input to an AND circuit 51 and its output signal is applied to the resistor 40 as the driving signal $V_S$. A light emitting diode 52a of a photocoupler is connected between the collector of the transistor 44 and the bases of transistors 6 and 7. The phototransistor 52b of the photocoupler is connected to the positive power supply through a resistor 53, and the common connection point is connected to a SET terminal of a time delay circuit 54. The current flowing through the transistor 44 is detected by the light emitting diode 52a, and the phototransistor 52b sends photocurrents, and thus the logic level signal is input to the SET terminal of the time delay circuit. The output of this time delay circuit 54 is input to a latch circuit 55. When the control signal $V_G$ rises, the time delay circuit is reset. At this time, if the collector current detected by the photocoupler 52 continues to flow longer than the predetermined time interval set by the time delay circuit 54, which means an accident in which the collector voltage $V_{CE}$ of the IGBT does not drop because of an overcurrent, accident information is held by the latch circuit 55. Therefore the output of the AND circuit 51 is off and the IGBT 1 is turned off to protect it from the accident.

Figure 19:
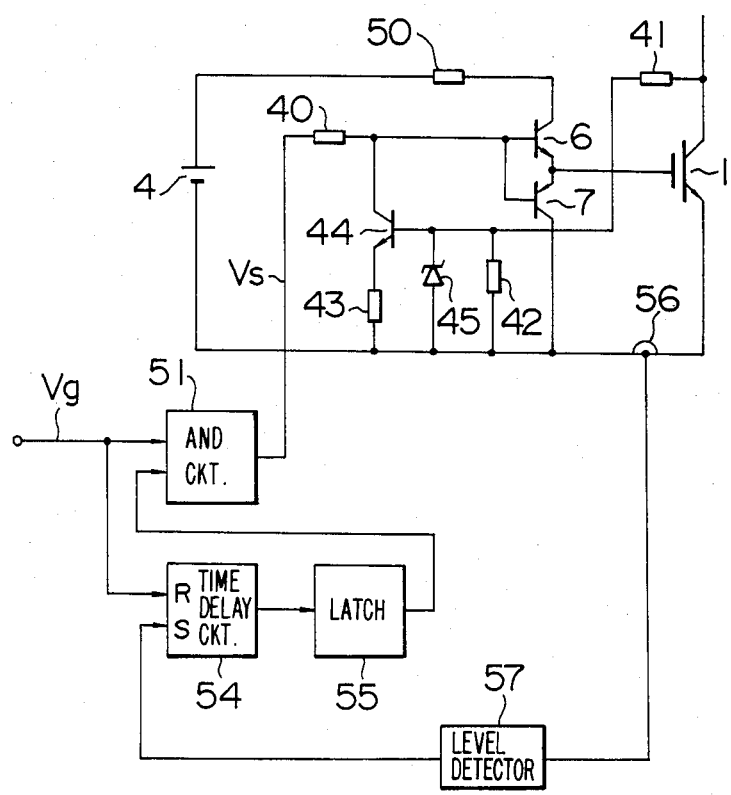

FIG. 19 shows a circuit diagram of another embodiment, in which the photocoupler 52 shown in FIG. 18 is removed and a current detector 56 is provided between the emitter of the IGBT 1 and the negative electrode of the power source 4. The output of the current detector 56 is input to the latch circuit 55 through a level detector 57.

According to this circuit, the collector to emitter voltage of the IGBT 1 is adjusted by the same operation as described by referring to FIG. 18, based on the direct collector current detection.

In the above embodiments, only one IGBT element is used. However, in the practical use, four or six IGBTs each of which has reversely connected free wheeling diode between collector and emitter are used to form a bridge.

Moreover, in the above embodiment, the adjustment point of the voltage adjustment circuit including the emitter-follower transistor is connected to input side of the amplifying transistor for gate of IGBT, but it may be connected to the output side of the amplifying transistor.

What is claimed is:

1. A protection circuit for an insulated gate bipolar transistor (IGBT) comprising:
   (a) a gate voltage input circuit for generating a gate voltage, and for supplying same to a gate of said IGBT;
   (b) a load connected in series with said IGBT;
   (c) a first detecting circuit means connected in circuit with said load for detecting an abnormality in said load;
   (d) adjusting circuit means responsive to said first detecting circuit means and connected to said gate voltage input circuit for adjusting said gate voltage of the IGBT;
   (e) a second detection circuit means for detecting whether an operation time of the adjusting circuit means exceeds a predetermined period, said second detection circuit means connected to said adjusting circuit means; and
   (f) wherein said adjusting circuit means first adjusts the gate voltage to a low voltage which is no less than a gate threshold voltage of the IGBT to decrease a fault current of said IGBT when the collector to emitter voltage of the IGBT is increased and, after elapse of said predetermined period adjusts the gate voltage to a voltage less than the threshold level to cut off the fault current.

2. A protection circuit according to claim 1, wherein said adjusting circuit means comprises a voltage divider circuit composed of a plurality of resistors connected in series, at least one of which is activated by a transistor which is turned on in response to the output of the first detection circuit means.

3. A protection circuit according to claim 1, wherein said adjusting circuit means comprises a voltage divider circuit composed of a first resistor and a parallel connected capacitor and a second resistor connected in series with said first resistor, the second resistor being activated by a transistor which is turned on in response to the output of the first detection circuit means.

4. A protection circuit according to claim 1, wherein said first detecting circuit means comprises a voltage divider circuit which includes a plurality of resistors and outputs a proportion value of the collector to emitter voltage of the IGBT.

5. A protection circuit according to claim 1, further comprising a third detection circuit means for detecting whether the adjusting circuit means is in operation.

6. A protection circuit according to claim 5, wherein said third detection circuit means comprises a photocoupler which operates by current flowing through the adjusting circuit means.

7. A protection circuit according to claim 5, wherein said third detection circuit means comprises a current detector which detects collector current of the IGBT.

8. A protection circuit according to claim 1, wherein said adjusting circuit means is inoperable for the predetermined period.

9. A protection circuit according to claim 1, wherein said control signal is set to OFF to turn off the IGBT after the predetermined period.

10. A protection circuit for an insulated gate bipolar transistor (IGBT) comprising:
- a gate voltage input circuit means for converting an input control signal to a driving signal and forming a gate voltage of the IGBT by amplifying said driving signal;
- a detecting circuit means for detecting a collector to emitter voltage of said IGBT; and
- an adjusting circuit means for adjusting the driving signal to control the gate voltage of the IGBT based on the output of the detecting circuit means;
- whereby the control of the IGBT is performed so that the gate voltage of the IGBT is adjusted by varying the driving signal according to a function of the collector to emitter voltage which is selected within a safe operation area (SOA) region and the control is stopped when the adjusting circuit operates continuously.

11. A protection circuit according to claim 10, wherein the adjusting circuit means comprises a voltage divider circuit for applying a proportion of the collector to emitter voltage to the adjusting circuit means.

12. A protection circuit according to claim 10, wherein said adjusting circuit means comprises a resistor and a Zener diode connected in series whereby said gate voltage is obtained by turning on the Zener diode.

13. A protection circuit according to claim 10, wherein the adjusting circuit means cuts off the IGBT after detecting that a main current has reached a predetermined set value.

14. A protection circuit according to claim 10, wherein said detecting circuit means further comprises a photocoupler which detects a voltage drop caused by a current flowing through the adjusting circuit means.

15. A protection circuit according to claim 10, wherein said detecting circuit means further comprises a current detector which detects the collector current of the IGBT.

* * * * *